US011387809B2

(12) United States Patent
Sung et al.

(10) Patent No.: US 11,387,809 B2
(45) Date of Patent: Jul. 12, 2022

(54) ACOUSTIC RESONATOR FILTER

(71) Applicant: SAMSUNG ELECTRO-MECHANICS CO., LTD., Suwon-si (KR)

(72) Inventors: Jung Woo Sung, Suwon-si (KR); Sung Tae Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 17/106,403

(22) Filed: Nov. 30, 2020

(65) Prior Publication Data

US 2022/0060177 A1 Feb. 24, 2022

(30) Foreign Application Priority Data

Aug. 19, 2020 (KR) ........................ 10-2020-0103879

(51) Int. Cl.
*H03H 9/56* (2006.01)
*H03H 9/02* (2006.01)
(Continued)

(52) U.S. Cl.
CPC .......... *H03H 9/566* (2013.01); *H03H 9/0014* (2013.01); *H03H 9/02102* (2013.01);
(Continued)

(58) Field of Classification Search
CPC .. H03H 9/566; H03H 9/0014; H03H 9/02102; H03H 9/0514; H03H 9/105; H03H 9/173; H03H 9/542; H03H 9/564
(Continued)

(56) References Cited

U.S. PATENT DOCUMENTS 9,154,110 B2  10/2015  Kim
9,712,135 B2 * 7/2017  Nishihara ................ H03H 3/04
(Continued)

FOREIGN PATENT DOCUMENTS

JP  2002-314372 A  10/2002
JP  2008-182511 A  8/2008
(Continued)

OTHER PUBLICATIONS

Taiwanese Office Action dated Jul. 14, 2021 issued in counterpart Taiwanese Patent Application No. 109143045 (7 pages in English and 6 pages in Taiwanese).
(Continued)

*Primary Examiner* — Rakesh B Patel
*Assistant Examiner* — Jorge L Salazar, Jr.
(74) *Attorney, Agent, or Firm* — NSIP Law

(57) ABSTRACT

An acoustic resonator filter includes at least one series acoustic resonator electrically connected between a first port and a second port in series, through which a radio frequency (RF) signal passes; at least one second shunt acoustic resonator electrically shunt-connected between the at least one series acoustic resonator and a ground; and at least one first shunt acoustic resonator electrically shunt-connected between the at least one series acoustic resonator and a ground and having a resonance frequency higher than a resonance frequency of the at least one second shunt acoustic resonator. At least one shunt acoustic resonator, among the at least one first shunt acoustic resonator and the at least one second shunt acoustic resonator has a temperature coefficient of frequency (TCF) corresponding to resonance frequency sensitivity more insensitive than resonance frequency sensitivity according to a change in temperature of the at least one series acoustic resonator filter.

20 Claims, 15 Drawing Sheets

(51) Int. Cl.
  *H03H 9/00* (2006.01)
  *H03H 9/10* (2006.01)
  *H03H 9/17* (2006.01)
  *H03H 9/54* (2006.01)
  *H03H 9/05* (2006.01)

(52) U.S. Cl.
  CPC .......... *H03H 9/0514* (2013.01); *H03H 9/105* (2013.01); *H03H 9/173* (2013.01); *H03H 9/542* (2013.01); *H03H 9/564* (2013.01)

(58) Field of Classification Search
  USPC .......................... 333/133, 186–188, 193–196
  See application file for complete search history.

(56) References Cited

U.S. PATENT DOCUMENTS

| | | | |
|---|---|---|---|
| 9,819,329 | B2 | 11/2017 | Tsurunari et al. |
| 2002/0180562 | A1 | 12/2002 | Taniguchi |
| 2013/0033337 | A1 | 2/2013 | Nishihara et al. |
| 2013/0249643 | A1 | 9/2013 | Kim et al. |
| 2019/0341911 | A1 | 11/2019 | Komatsu et al. |
| 2019/0386642 | A1 | 12/2019 | Komatsu |
| 2021/0058068 | A1 | 2/2021 | Michigami |

FOREIGN PATENT DOCUMENTS

| | | |
|---|---|---|
| JP | 2014-68123 A | 4/2014 |
| KR | 10-2004-0100484 A | 12/2004 |
| KR | 10-1918282 B1 | 11/2018 |
| KR | 10-2019-0066070 A | 6/2019 |
| TW | 202002304 A | 1/2020 |

OTHER PUBLICATIONS

Korean the Office Action dated Mar. 29, 2022, in the corresponding Korean Patent Application No. 10-2020-0103879. (8 pages in English and 6 pages in Korean).

* cited by examiner

ACOUSTIC RESONATOR FILTER

CROSS-REFERENCE TO RELATED APPLICATION(S)

This application claims the benefit under 35 USC 119(a) of Korean Patent Application No. 10-2020-0103879 filed on Aug. 19, 2020 in the Korean Intellectual Property Office, the entire disclosure of which is incorporated herein by reference for all purposes.

BACKGROUND

1. Field

The following description relates to an acoustic resonator filter.

2. Description of Related Art

With the rapid development of mobile communications devices, chemical and biological testing-related devices, and the like, demand for small and lightweight filters, oscillators, resonant elements, acoustic resonant mass sensors, and the like, used in such devices, is increasing.

Acoustic resonators such as bulk acoustic wave (BAW) filters may be configured as a means of implementing the small and lightweight filters, the oscillators, the resonant elements, the acoustic resonance mass sensors, and the like, and may have a relatively small size and relatively good performance, as compared to dielectric filters, metal cavity filters, wave guides, or the like. Therefore, the acoustic resonators may be widely used in communications modules of modern mobile devices that require relatively good performance (e.g., a relatively wide pass bandwidth).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide an acoustic resonator filter.

In one general aspect, an acoustic resonator filter includes at least one series acoustic resonator electrically connected between a first port and a second port in series, through which a radio frequency (RF) signal passes; at least one second shunt acoustic resonator electrically shunt-connected between the at least one series acoustic resonator and a ground; and at least one first shunt acoustic resonator electrically shunt-connected between the at least one series acoustic resonator and a ground and having a resonance frequency higher than a resonance frequency of the at least one second shunt acoustic resonator, wherein at least one shunt acoustic resonator, among the at least one first shunt acoustic resonator and the at least one second shunt acoustic resonator, has a temperature coefficient of frequency (TCF) corresponding to resonance frequency sensitivity more insensitive than resonance frequency sensitivity according to a change in temperature of the at least one series acoustic resonator filter.

The resonance frequency of the at least one first shunt acoustic resonator may be closer to the resonance frequency of the at least one series acoustic resonator than the resonance frequency of the at least one second shunt acoustic resonator.

The at least one second shunt acoustic resonator may include one or more second shunt acoustic resonators connected to the at least one first shunt acoustic resonator in series and one or more second shunt acoustic resonators connected to the at least one first shunt acoustic resonator in parallel.

The at least one second shunt acoustic resonator may include one or more second shunt acoustic resonators electrically connected to a first end of one series acoustic resonator, among the at least one series acoustic resonators, and one or more second shunt acoustic resonators electrically connected to a second end of the one series acoustic resonator, and having different TCFs.

The acoustic resonator filter may include a plurality of inductors electrically connected between the at least one second shunt acoustic resonator and a ground in series; and a capacitor electrically connected between the at least one second shunt acoustic resonator and a ground in series.

The acoustic resonator filter may include an inductor electrically connected between one or both of the at least one first shunt acoustic resonator and the at least one second shunt acoustic resonator and a ground in series.

A difference between a bandwidth at −40 degrees Celsius and a bandwidth at +95 degrees Celsius may be less than 20 MHz.

The acoustic resonator filter may have insertion loss of less than 2.27 dB at a temperature between −40 degrees Celsius and +95 degrees Celsius and a frequency of 3.5 GHz, and may have insertion loss of less than 2.33 dB at a temperature between −40 degrees Celsius and +95 degrees Celsius and a frequency of 3.6 GHz.

Each of the at least one first shunt acoustic resonator, the at least one second shunt acoustic resonator, and the at least one series acoustic resonator may include a first electrode and a second electrode, spaced apart from each other, respectively; and a piezoelectric layer disposed between the respective first and second electrodes. At least one shunt acoustic resonator, among the at least one first shunt acoustic resonator and the at least one second shunt acoustic resonator, may include a $SiO_2$ layer disposed between the first and second electrodes or disposed to contact the first and second electrodes, and the at least one series acoustic resonator may not include a $SiO_2$ layer or may include a $SiO_2$ layer smaller than the $SiO_2$ layer of the at least one shunt acoustic resonator.

The acoustic resonator filter may include an insulating layer disposed below the at least one first shunt acoustic resonator and the at least one second shunt acoustic resonator and below the at least one series acoustic resonator; and a substrate disposed below the insulating layer, wherein the $SiO_2$ layer may be disposed on or above the insulating layer.

In another general aspect, an acoustic resonator filter includes at least one series acoustic resonator electrically connected between a first port and a second port in series, through which a radio frequency (RF) signal passes; at least one second shunt acoustic resonator electrically shunt-connected between the at least one series acoustic resonator and a ground; and at least one first shunt acoustic resonator electrically shunt-connected between the at least one series acoustic resonator and a ground and having a resonance frequency, higher than a resonance frequency of the at least one second shunt acoustic resonator, wherein each of the at least one first shunt acoustic resonator and the at least one second shunt acoustic resonator and the at least one series acoustic resonator comprise a first electrode and a second electrode, spaced apart from each other, respectively; and a piezoelectric layer disposed between the respective first and second electrodes, wherein at least one shunt acoustic resonator, among the at least one first shunt acoustic resonator and the at least one second shunt acoustic resonator, further comprises a $SiO_2$ layer disposed between the first and second electrodes or disposed to contact the first and second electrodes, wherein the at least one series acoustic resonator does not include a $SiO_2$ layer or includes a $SiO_2$ layer smaller than the $SiO_2$ layer of the at least one shunt acoustic resonator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
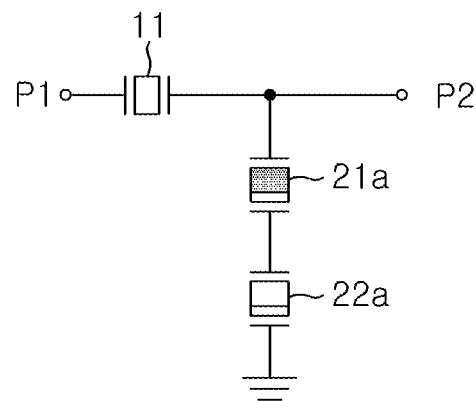
FIGS. 1A, 1B, 1C, 1D, 1E, and 1F are views illustrating an acoustic resonator filter according to various examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1A is a view illustrating an acoustic resonator filter according to an example of the present disclosure.

Referring to FIG. 1A, an acoustic resonator filter 50a may include a series acoustic resonator 11, a first shunt acoustic resonator 21a, and a second shunt acoustic resonator 22a, and may pass or block a radio frequency (RF) signal between a first port P1 and a second port P2, according to a frequency of an RF signal.

An electrical connection node between the series acoustic resonator 11 and the first and second shunt acoustic resonators 21a and 22a may be implemented with a material having a relatively low specific resistance, such as gold (Au), a gold-tin (Au—Sn) alloy, copper (Cu), a copper-tin (Cu—Sn) alloy, aluminum (Al), an aluminum alloy, or the like, but the material is not limited thereto.

The series acoustic resonator 11 and the first and second shunt acoustic resonators 21a and 22a may convert electrical energy of the RF signal into mechanical energy, and vice versa, due to piezoelectric characteristics, respectively. As a frequency of the RF signal approaches that of resonance frequencies of the acoustic resonators, an energy transfer rate between a plurality of electrodes may greatly increase. As a frequency of the RF signal approaches that of anti-resonance frequencies of the acoustic resonators, an energy transfer rate between a plurality of electrodes may greatly decrease. Therefore, depending on the piezoelectric characteristics, an anti-resonance frequency may be higher than a resonance frequency.

The series acoustic resonator 11 may be electrically connected between the first and second ports P1 and P2 in series, may increase a pass rate of the RF signal between the first and second ports P1 and P2, as a frequency of the RF signal approaches that of a resonance frequency, and may decrease a pass rate of the RF signal between the first and second ports P1 and P2, as a frequency of the RF signal approaches that of an anti-resonance frequency.

The first and second shunt acoustic resonators 21a and 22a may be electrically shunt-connected between the series acoustic resonator 11 and a ground, may increase a pass rate of the RF signal facing a ground, as a frequency of the RF signal approaches that of a resonance frequency, and may decrease a pass rate of the RF signal facing a ground, as a frequency of the RF signal approaches that of an anti-resonance frequency.

A pass rate of the RF signal between the first and second ports P1 and P2 may decrease, as a pass rate of the RF signal facing a ground increases, and may increase, as a pass rate of the RF signal facing a ground decreases.

For example, a pass rate of the RF signal between the first and second ports P1 and P2 may decrease, as a frequency of the RF signal approaches that of resonance frequencies of the first and second shunt acoustic resonators 21a and 22a, or anti-resonance frequency of the series acoustic resonator 11.

Since the anti-resonance frequency may be higher than the resonance frequency, the acoustic resonator filter 50a may have a pass bandwidth formed by the lowest frequency corresponding to resonance frequencies of the first and second shunt acoustic resonators 21a and 22a, and the highest frequency corresponding to anti-resonance frequency of the series acoustic resonator 11.

The pass bandwidth may widen, as a difference between the resonance frequencies of the first and second shunt acoustic resonators 21a and 22a and the anti-resonance frequency of the series acoustic resonator 11 increases. When the difference is too large, the pass bandwidth may be split.

When a resonance frequency of the series acoustic resonator 11 is slightly higher than anti-resonance frequencies of the first and second shunt acoustic resonators 21a and 22a, a bandwidth of the acoustic resonator filter 50a may be relatively wide, but may not be split.

In an acoustic resonator, a difference between the resonance frequency and the anti-resonance frequency may be determined, based on $kt^2$ (an electromechanical coupling factor), a physical characteristic of the acoustic resonator. When a size or a shape of the acoustic resonator is changed, the resonance frequency and the anti-resonance frequency may be changed.

The first shunt acoustic resonator 21a may have a resonance frequency, higher than a resonance frequency of the second shunt acoustic resonator 22a.

Figure 2:
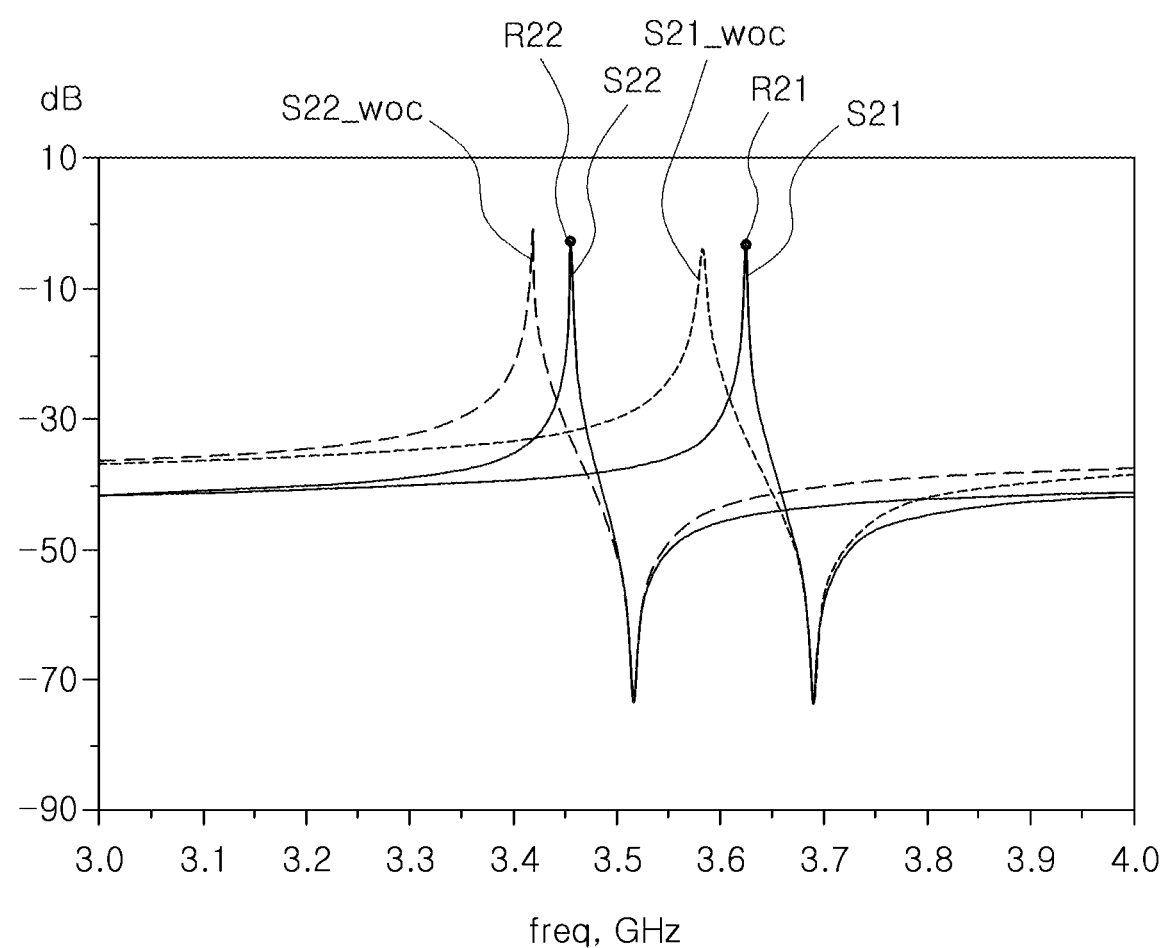
FIG. 2 is a graph illustrating movement of resonance frequencies of first and second shunt acoustic resonators of an acoustic resonator filter according to an example.

FIG. 2 is a graph illustrating movement of resonance frequencies of first and second shunt acoustic resonators of an acoustic resonator filter according to an embodiment of the present disclosure.

Referring to FIG. 2, a first resonance frequency R21 of an admittance curve S21 of a first shunt acoustic resonator may be higher than a second resonance frequency R22 of an admittance curve S22 of a second shunt acoustic resonator.

The admittance curves S21 and S22 of the first and second shunt acoustic resonators when the first and second shunt acoustic resonators are connected to each other may further move toward a right side (a relatively high frequency direction), as compared to admittance curves S21_woc and S22_woc of the first and second shunt acoustic resonators when the first and second shunt acoustic resonators are not connected to each other.

For example, a resonance frequency of the second shunt acoustic resonator may be closer to a resonance frequency of the series acoustic resonator, as compared to a resonance frequency of the first shunt acoustic resonator. For example, the resonance frequency of the second shunt acoustic resonator may be substantially the same as the resonance frequency of the series acoustic resonator.

Referring back to FIG. 1A, since the first and second shunt acoustic resonators 21a and 22a may act as capacitors with regard to each other, resonance frequencies of each other may increase.

Therefore, a transmission zero pole may be formed near resonance frequencies of the first and second shunt acoustic resonators 21a and 22a, and may be formed near a bandwidth of the acoustic resonator filter 50a, and attenuation characteristics of the bandwidth may be improved. For example, a transmission zero pole may increase a change rate of admittance according to a change in frequency (freq) at the lowest frequency and/or the highest frequency of the bandwidth, and may sharply effectuate skirt characteristics of the acoustic resonator filter 50a.

The transmission zero pole may be relatively more sensitive to a change in temperature. For example, sensitivity of a performance (e.g., attenuation, insertion loss, return loss, pass band ripple, and the like) of the acoustic resonator filter, according to a change in temperature, may be relatively high when the transmission zero pole is used.

An acoustic resonator filter 50a may obtain a more stable performance with regard to a change in temperature, even while using a transmission zero pole.

Figure 3A:
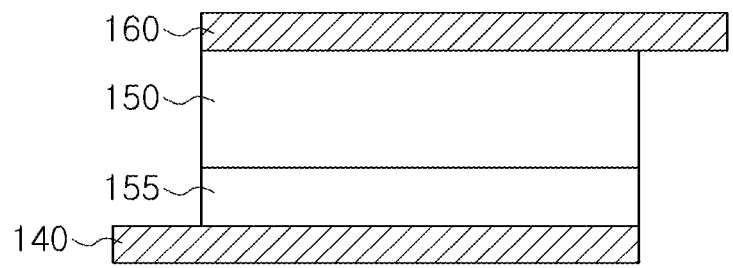
FIG. 3A is a view illustrating an acoustic resonator including a $SiO_2$ layer of an acoustic resonator filter according to an example.
Figure 3B:
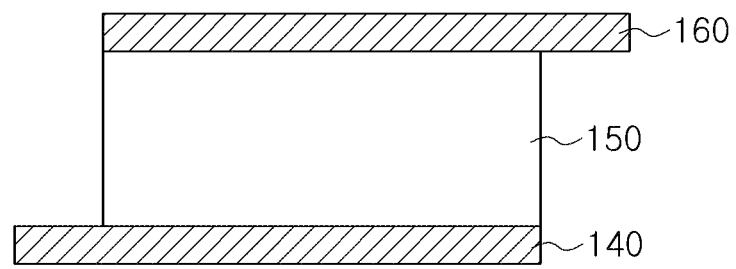
FIG. 3B is a view illustrating an acoustic resonator not including a $SiO_2$ layer of an acoustic resonator filter according to an example.

FIG. 3A is a view illustrating an acoustic resonator including a $SiO_2$ layer of an acoustic resonator filter according to an example of the present disclosure, and FIG. 3B is a view illustrating an acoustic resonator not including a $SiO_2$ layer of an acoustic resonator filter according to an example of the present disclosure.

Referring to FIGS. 3A and 3B, a resonance unit 135a of an acoustic resonator including a $SiO_2$ layer includes a first electrode 140, a second electrode 160, a piezoelectric layer 150, and a $SiO_2$ layer 155. A resonance unit 135b of an acoustic resonator not including a $SiO_2$ layer may include a first electrode 140, a second electrode 160, and a piezoelectric layer 150.

The first and second electrodes 140 and 160 may be formed using a conductive material such as molybdenum (Mo) or alloys thereof to improve coupling efficiency with the piezoelectric layer 150, but are not limited thereto, and may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The piezoelectric layer 150 may include a piezoelectric material to generate a piezoelectric effect converting electrical energy into mechanical energy having a form of an acoustic wave. For example, the piezoelectric material may include one of aluminum nitride (AlN), zinc oxide (ZnO), lead zirconium titanium oxide (PZT; PbZrTiO), may further include at least one of a rare earth metal or a transition metal, and may also include magnesium (Mg), a divalent metal. For example, the rare earth metal may include at least one of scandium (Sc), erbium (Er), yttrium (Y), or lanthanum (La), and the transition metal may include at least one of titanium (Ti), zirconium (Zr), hafnium (Hf), tantalum (Ta), or niobium (Nb).

The $SiO_2$ layer 155 may include $SiO_2$, and may have a temperature coefficient of frequency (TCF), opposite to a TCF of the piezoelectric layer 150. For example, the $SiO_2$ layer 155 may have a TCF cancelling a change in frequency, according to a change in temperature of the piezoelectric layer 150.

Therefore, sensitivity of a resonance frequency of the acoustic resonator including the $SiO_2$ layer 155 according to a change in temperature may be more insensitive than sensitivity of a resonance frequency of the acoustic resonator not including the $SiO_2$ layer 155 according to a change in temperature. For example, a TCF of the acoustic resonator including the $SiO_2$ layer 155 may be smaller than a TCF of the acoustic resonator not including the $SiO_2$ layer 155.

Figure 4A:
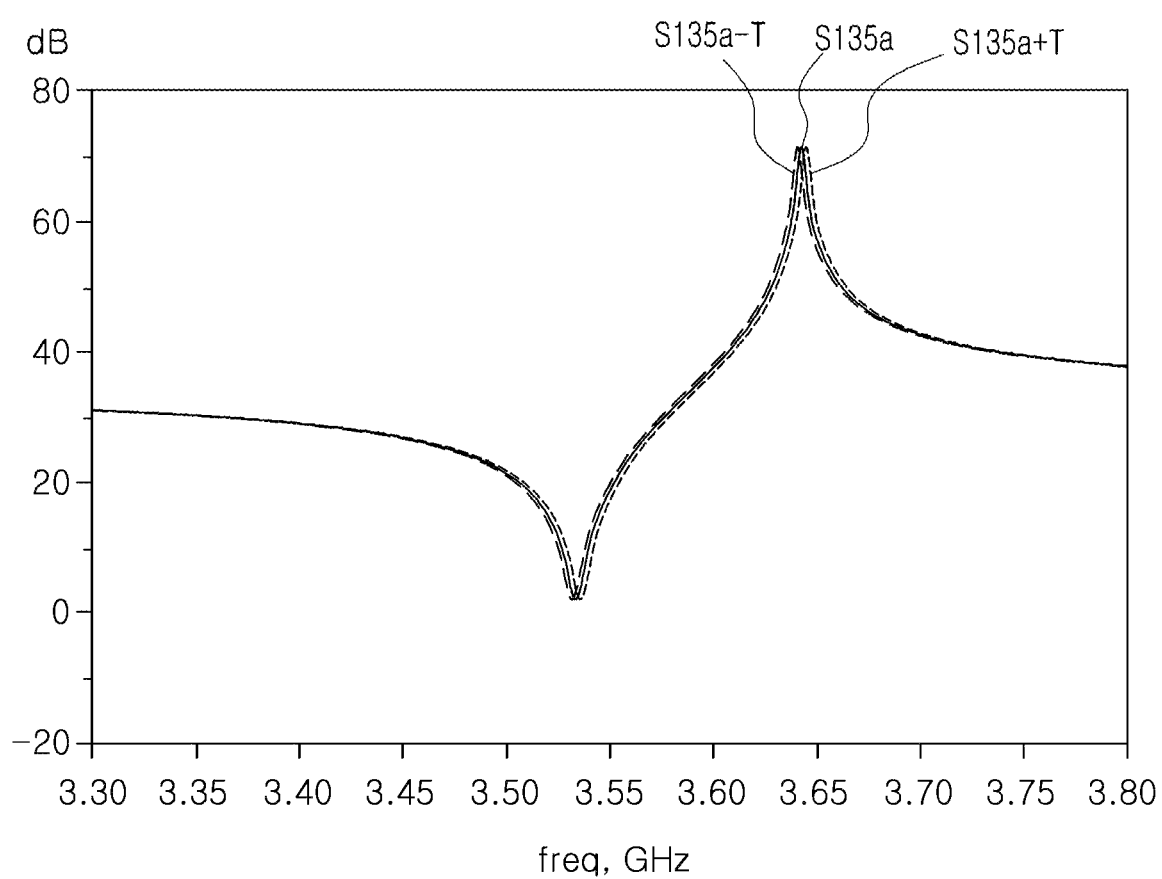
FIG. 4A is a graph illustrating a change in frequency characteristics according to a change in temperature of the acoustic resonator of FIG. 3A.
Figure 4B:
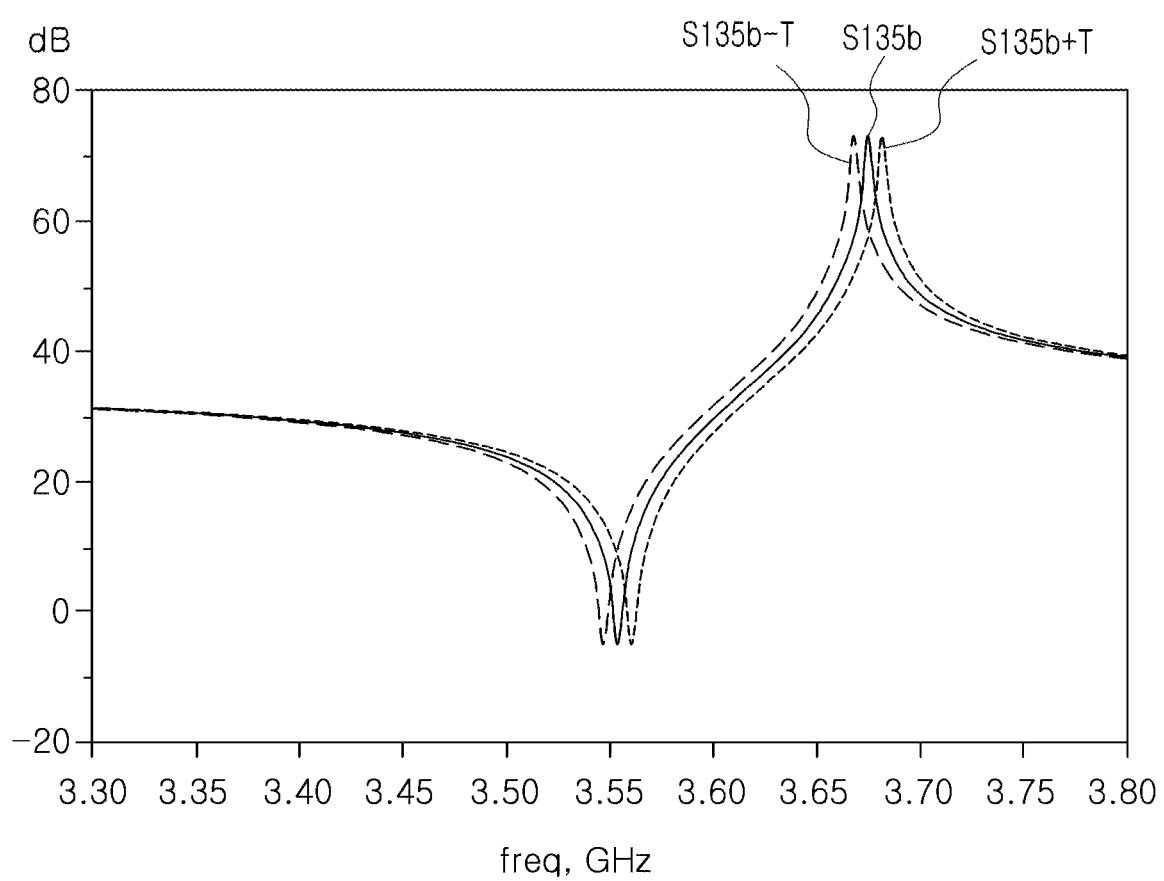
FIG. 4B is a graph illustrating a change in frequency characteristics according to a change in temperature of the acoustic resonator of FIG. 3B.

FIG. 4A is a graph illustrating a change in frequency characteristics according to a change in temperature of the acoustic resonator of FIG. 3A, and FIG. 4B is a graph illustrating a change in frequency characteristics according to a change in temperature of the acoustic resonator of FIG. 3B.

Referring to FIG. 4A, a difference between an S-parameter S135a at 25 degrees Celsius, an S-parameter S135a− T at −40 degrees Celsius, and an S-parameter S135a+ T at 90 degrees Celsius, in an acoustic resonator including a $SiO_2$ layer, may be small due to a relatively small TCF.

Referring to FIG. 4B, a difference between an S-parameter S135b at 25 degrees Celsius, an S-parameter S135b− T at −40 degrees Celsius, and an S-parameter S135b+ T at 90 degrees Celsius, in an acoustic resonator not including a $SiO_2$ layer, may be large due to a relatively large TCF.

For example, a TCF of the acoustic resonator not including the $SiO_2$ layer 155 may be 28 ppm/K, and a TCF of the acoustic resonator including the $SiO_2$ layer 155 may be 8 ppm/K. In this case, ppm/K may refer to a unit of a change rate in frequency characteristics when a temperature changes by 1 degree.

Referring to FIGS. 3A and 3B again, since the $SiO_2$ layer 155 has a smaller piezoelectric effect than the piezoelectric layer 150 or does not have a piezoelectric effect, energy loss due to energy conversion/reverse conversion of the acoustic resonator including the $SiO_2$ layer 155 may be greater than energy loss due to energy conversion/reverse conversion of the acoustic resonator not including the $SiO_2$ layer 155.

For example, the acoustic resonator including the $SiO_2$ layer 155 may have an advantage of having a relatively small TCF, and the acoustic resonator not including the $SiO_2$ layer 155 may have an advantage of having relatively low energy loss due to energy conversion/reverse conversion.

Referring back to FIG. 1A, at least one of the first and second shunt acoustic resonators 21a and 22a of the acoustic resonator filter 50a may have a TCF corresponding to resonance frequency sensitivity, more insensitive than resonance frequency sensitivity according to a change in temperature of the series acoustic resonator 11.

Depending on a design, the series acoustic resonator 11 of the acoustic resonator filter 50a may be configured not to include a $SiO_2$ layer or to include a smaller $SiO_2$ layer, as compared to the $SiO_2$ layer 155.

Therefore, the acoustic resonator filter 50a may reduce temperature sensitivity of the transmission zero pole to have a more stable performance and temperature robustness, while suppressing an increase in overall energy loss due to the reduction in temperature sensitivity.

FIGS. 1B to 1F are views illustrating an acoustic resonator filter according to various examples of the present disclosure. Discussion of repeated reference numbers may be omitted.

Figure 1B:
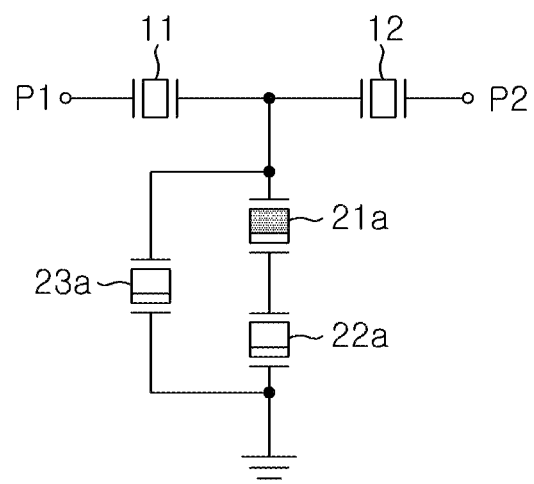

Referring to FIG. 1B, an acoustic resonator filter 50b may include a series acoustic resonator 11, a first shunt acoustic resonator 21a, and a plurality of second shunt acoustic resonators 22a and 23a.

The plurality of second shunt acoustic resonators 22a and 23a may be connected to the first shunt acoustic resonator 21a in series and parallel, respectively. Therefore, a transmission zero pole formed by the first shunt acoustic resonator 21a and the plurality of second shunt acoustic resonators 22a and 23a may be designed more precisely, and a performance of the acoustic resonator filter 50b may be further improved.

Figure 1C:
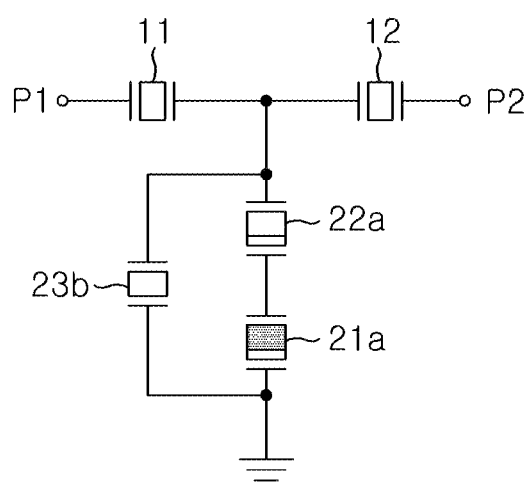

Referring to FIG. 1C, an acoustic resonator filter 50c may include a series acoustic resonator 11, a first shunt acoustic resonator 21a, and a plurality of second shunt acoustic resonators 22a and 23b.

Depending on a design, the first shunt acoustic resonator 21a may be disposed closer to a ground, as compared to the plurality of second shunt acoustic resonators 22a and 23b, and the second shunt acoustic resonator 23b and one of the plurality of second shunt acoustic resonators 22a and 23b, may be configured not to include a $SiO_2$ layer.

Figure 1D:
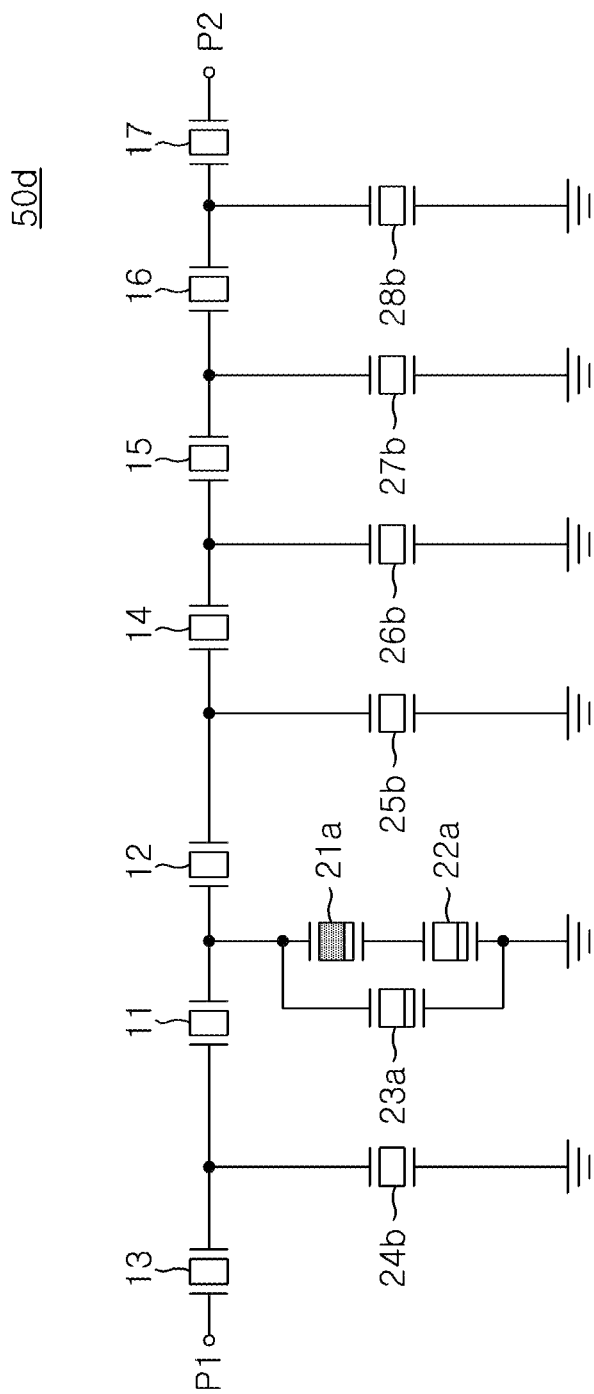

Referring to FIG. 1D, an acoustic resonator filter 50d may include a plurality of series acoustic resonators 11, 12, 13, 14, 15, 16, and 17, a first shunt acoustic resonator 21a, and a plurality of second shunt acoustic resonators 22a, 23a, 24b, 25b, 26b, 27b, and 28b.

The second shunt acoustic resonators 22a and 23a and the second shunt acoustic resonators 24b, among the plurality of second shunt acoustic resonators 22a, 23a, 24b, 25b, 26b, 27b, and 28b, may be electrically connected to one end and the other end of the series acoustic resonator 11, respectively, and may have different TCFs. For example, the second shunt acoustic resonators 24 may be configured not to include a $SiO_2$ layer.

Therefore, the acoustic resonator filter 50d may have poles of more orders, such that an increase in insertion loss may be more efficiently suppressed while having more improved attenuation characteristics, and low temperature sensitivity of a transmission zero pole may also be secured.

For example, the plurality of second shunt acoustic resonators 24b, 25b, 26b, 27b, and 28b may be configured not to include a $SiO_2$ layer.

Figure 1E:
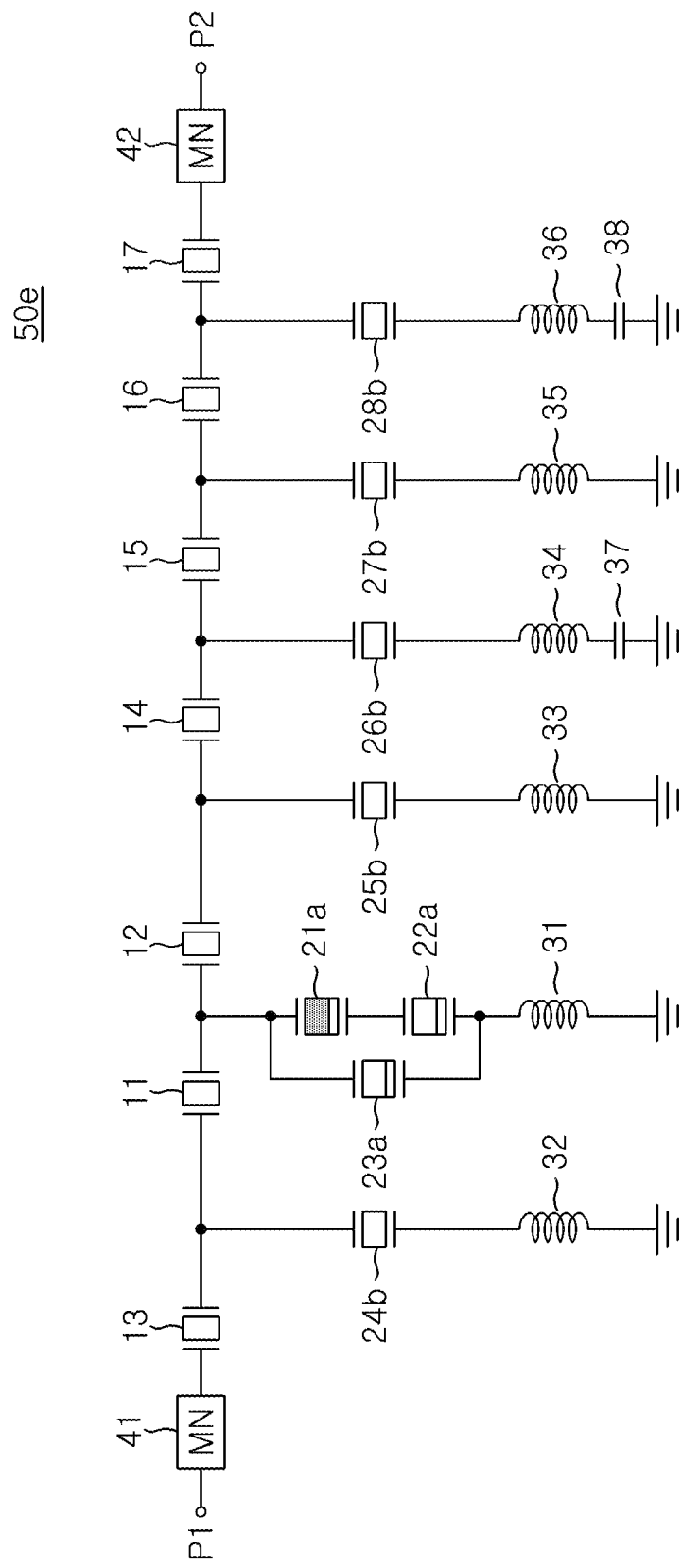

Referring to FIG. 1E, an acoustic resonator filter 50e may include a plurality of series acoustic resonators 11, 12, 13, 14, 15, 16, and 17, a first shunt acoustic resonator 21a, a plurality of second shunt acoustic resonators 22a, 23a, 24b, 25b, 26b, 27b, and 28b, a plurality of inductors 31, 32, 33, 34, 35, and 36, capacitors 37 and 38, a first matching circuit 41, and a second matching circuit 42.

The plurality of inductors 31, 32, 33, 34, 35, and 36 may be electrically connected between at least a portion of the plurality of second shunt acoustic resonators 22a, 23a, 24b, 25b, 26b, 27b, and 28b, and a ground in series, respectively.

Inductance of the plurality of inductors 31, 32, 33, 34, 35, and 36 may shift resonance frequencies of at least a portion of the plurality of second shunt acoustic resonators 22a, 23a, 24b, 25b, 26b, 27b, and 28b, and may not substantially contribute to anti-resonance frequencies. Therefore, a difference between resonance frequencies and anti-resonance frequencies of at least a portion of the plurality of second shunt acoustic resonators 22a, 23a, 24b, 25b, 26b, 27b, and 28b may increase due to inductance of the plurality of inductors 31, 32, 33, 34, 35, and 36.

Therefore, a bandwidth of the acoustic resonator filter 50e may be more efficiently widened. In this case, attenuation characteristics of the widened bandwidth may be secured by a transmission zero pole formed by the first shunt acoustic resonator 21a and the second shunt acoustic resonator 22a.

The capacitors 37 and 38 may be electrically connected only between some of the plurality of second shunt acoustic resonators 22a, 23a, 24b, 25b, 26b, 27b, and 28b, and the ground in series. The capacitors 37 and 38 may affect frequency characteristics of a portion of the plurality of second shunt acoustic resonators 22a, 23a, 24b, 25b, 26b, 27b, and 28b, and may act as an additional design factor for improving a performance.

Each of the first and second matching circuits 41 and 42 may assist a bandwidth of the acoustic resonator filter 50e, and may be formed as a passive element.

Figure 1F:
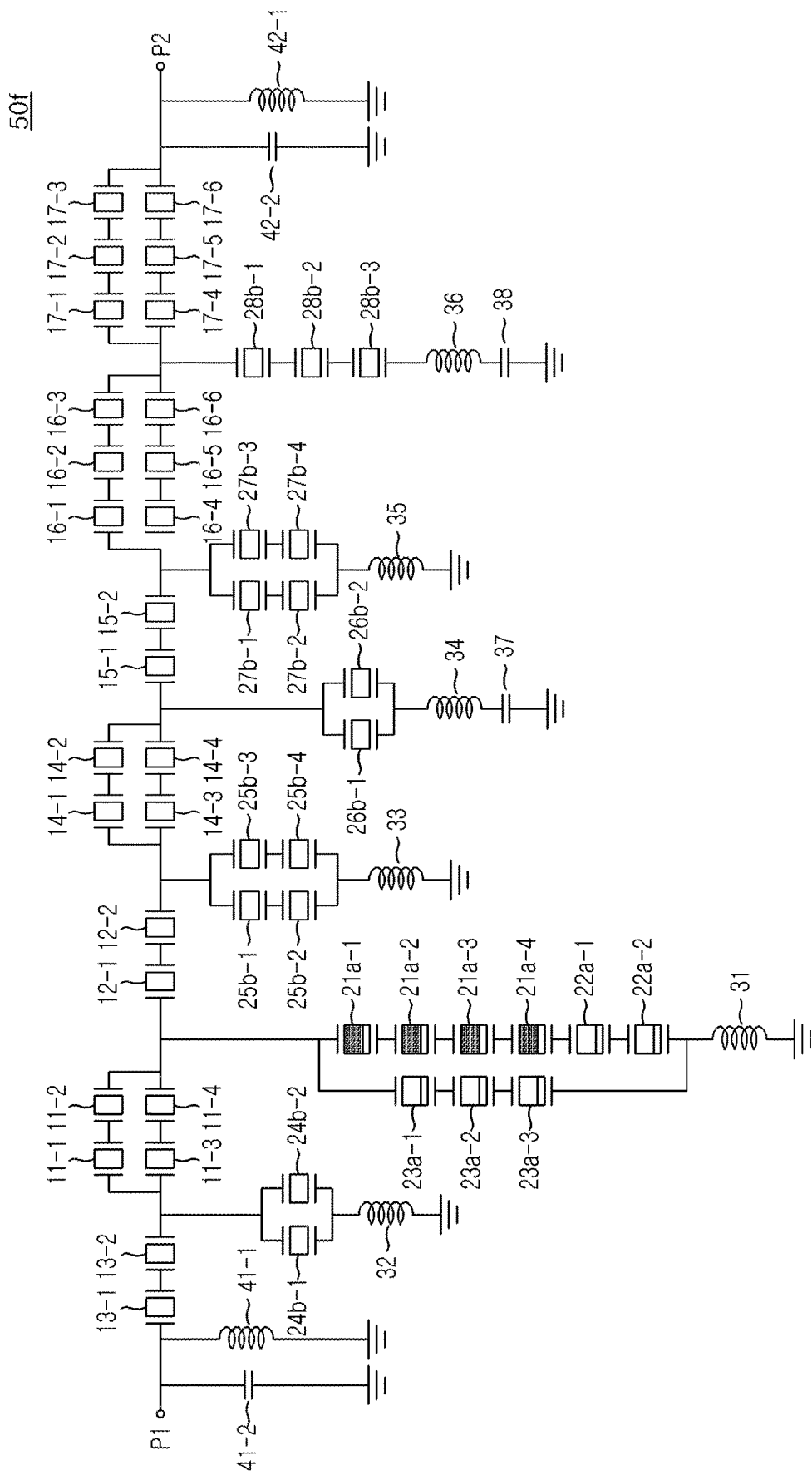

Referring to FIG. 1F, an acoustic resonator filter 50f may include a plurality of series acoustic resonators 11-1, 11-2, 11-3, 11-4, 12-1, 12-2, 13-1, 13-2, 14-1, 14-2, 14-3, 14-4, 15-1, 15-2, 16-1, 16-2, 16-3, 16-4, 16-5, 16-6, 17-1, 17-2, 17-3, 17-4, 17-5, and 17-6, first shunt acoustic resonators 21a-1, 21a-2, 21a-3, and 21a-4, a plurality of second shunt acoustic resonators 22a-1, 22a-2, 23a-1, 23a-2, 23a-3, 24b-1, 24b-2, 25b-1, 25b-2, 25b-3, 25b-4, 26b-1, 26b-2, 27b-1, 27b-2, 27b-3, 27b-4, 28b-1, 28b-2, and 28b-3, a plurality of inductors 31, 32, 33, 34, 35, and 36, capacitors 37 and 38, a first matching inductor 41-1, a first matching capacitor 41-2, a second matching inductor 42-1, and a second matching capacitor 42-2.

The first matching inductor 41-1 and the first matching capacitor 41-2 may correspond to the first matching circuit 41 of FIG. 1E. The second matching inductor 42-1 and the second matching capacitor 42-2 may correspond to the second matching circuit 42 of FIG. 1E.

Figure 5A:
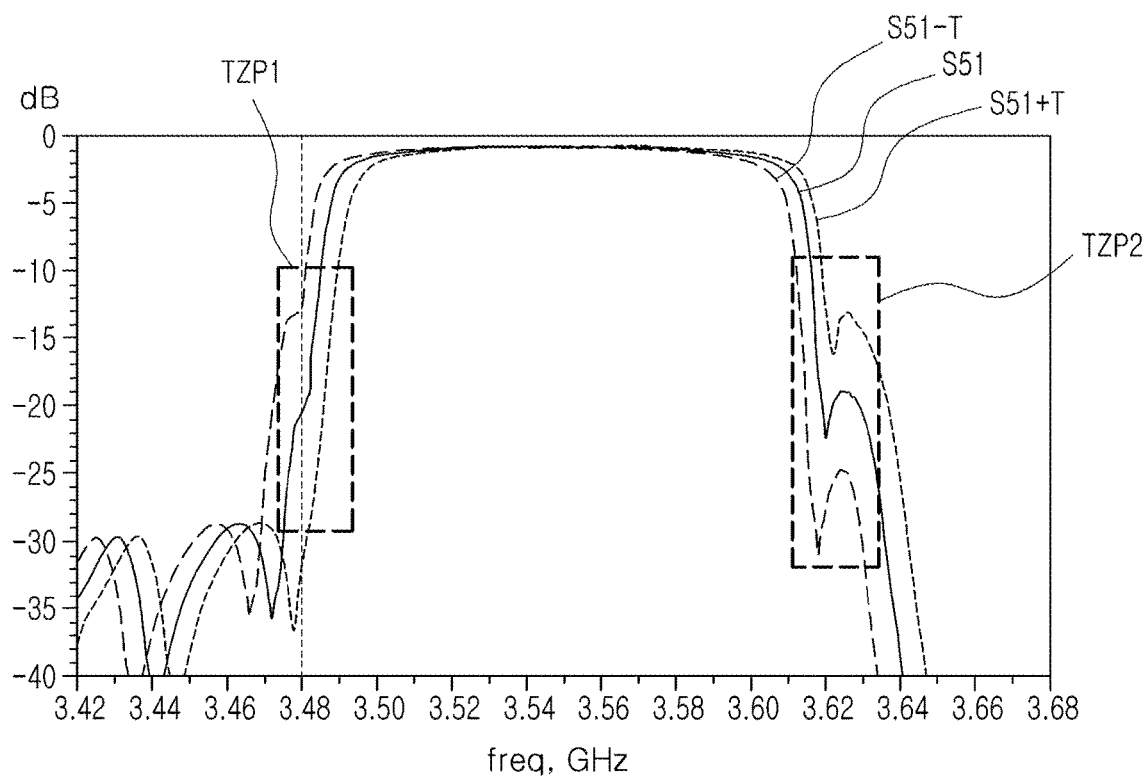
FIG. 5A is a graph illustrating S-parameters of an acoustic resonator filter according to an example.
Figure 5B:
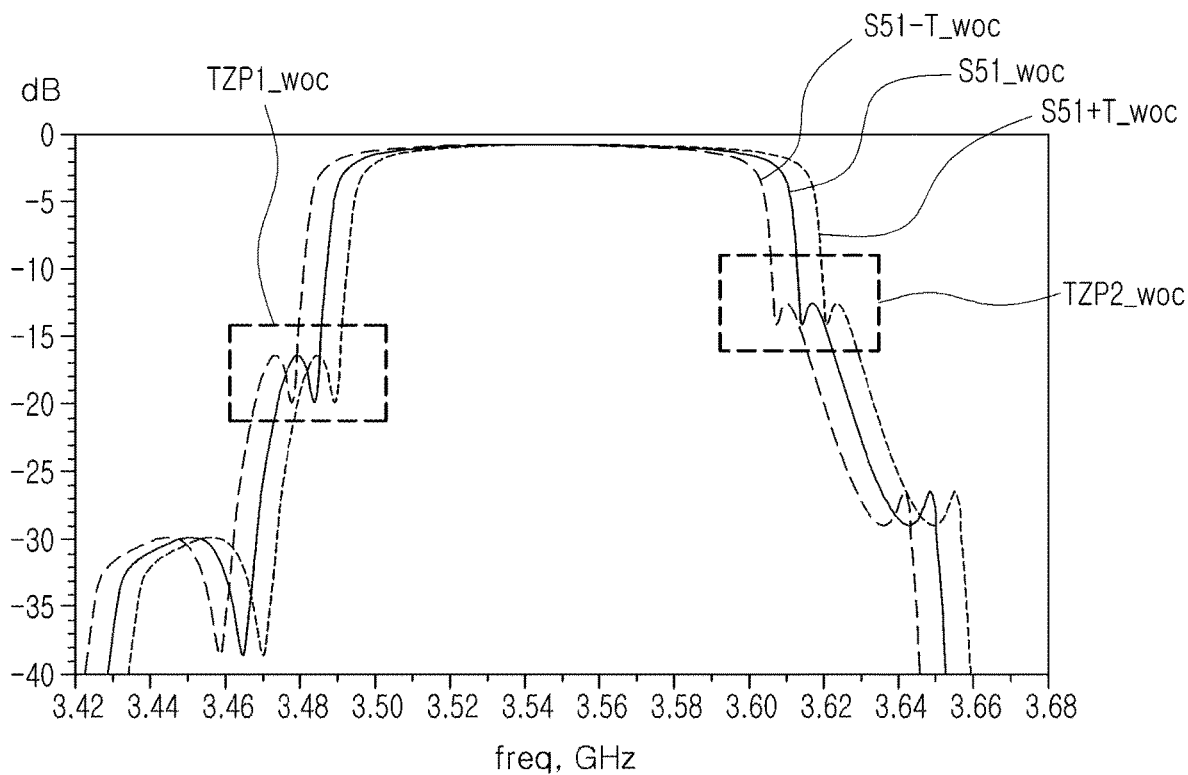
FIG. 5B is a graph illustrating S-parameters of an acoustic resonator filter in which a $SiO_2$ layer of a shunt acoustic resonator is omitted.

FIG. 5A is a graph illustrating S-parameters of an acoustic resonator filter according to an example of the present disclosure, and FIG. 5B is a graph illustrating S-parameters of an acoustic resonator filter in which a $SiO_2$ layer of a shunt acoustic resonator is omitted.

Referring to FIG. 5A, a difference between an S-parameter S51 at 25 degrees Celsius, an S-parameter S51−T at −40 degrees Celsius, and an S-parameter S51+T at 90 degrees Celsius, in the acoustic resonator filter illustrated in FIG. 1F, may be relatively small. A transmission zero pole may be formed in at least one of the lowest frequency region TZP1 or the highest frequency region TZP2 of a bandwidth.

Therefore, a difference between a bandwidth at −40 degrees Celsius and a bandwidth at +95 degrees Celsius, in the acoustic resonator filter according to an example of the present disclosure, may be less than 20 MHz. In this case, the bandwidths may be defined on the basis of −12 dB.

Referring to FIG. 5B, a difference between an S-parameter S51_woc at 25 degrees Celsius, an S-parameter S51−T_woc at −40 degrees Celsius, and an S-parameter S51+T_woc at 90 degrees Celsius, in the acoustic resonator filter in which the $SiO_2$ layer of the shunt acoustic resonator is omitted, may be relatively large. A transmission zero pole may be formed in at least one of the lowest frequency region TZP1_woc or the highest frequency region TZP2_woc of a bandwidth. In this case, a difference between a bandwidth at −40 degrees Celsius and a bandwidth at +95 degrees Celsius may exceed 20 MHz.

Figure 6A:
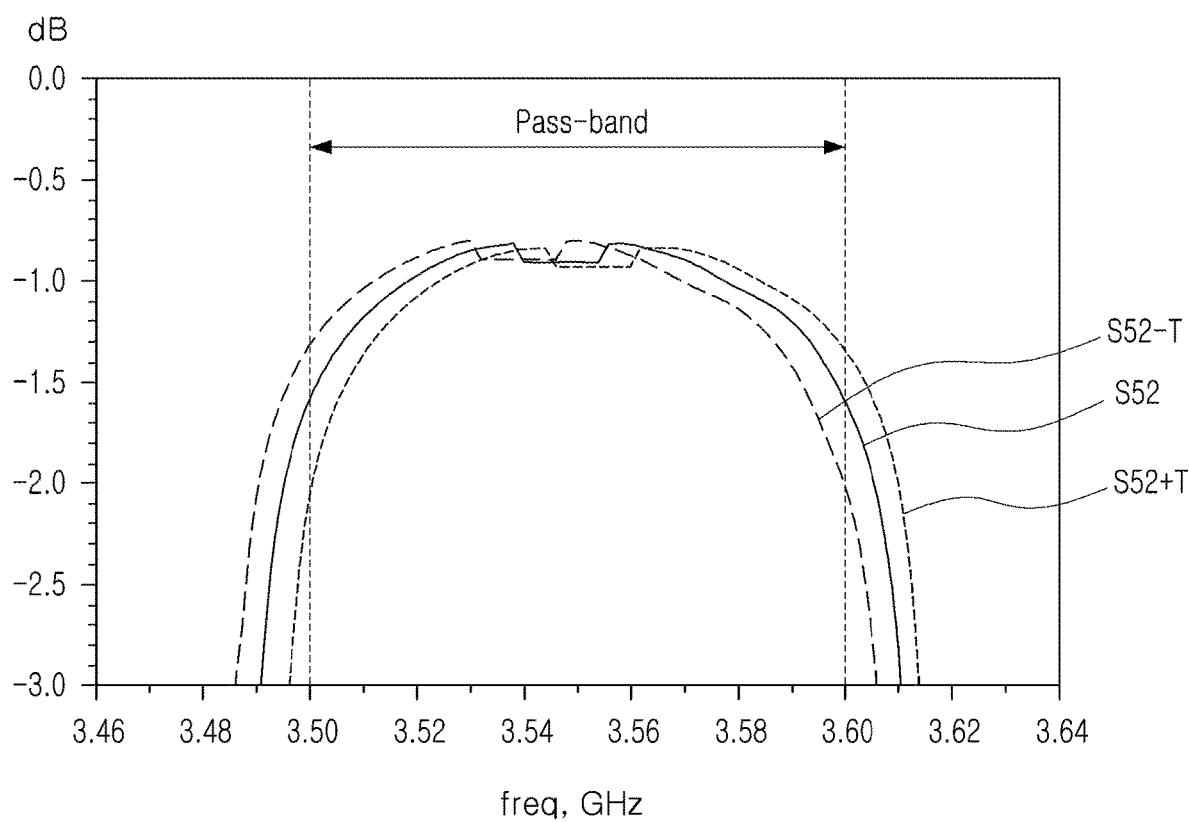
FIG. 6A is a graph illustrating insertion loss of an acoustic resonator filter according to an example.
Figure 6B:
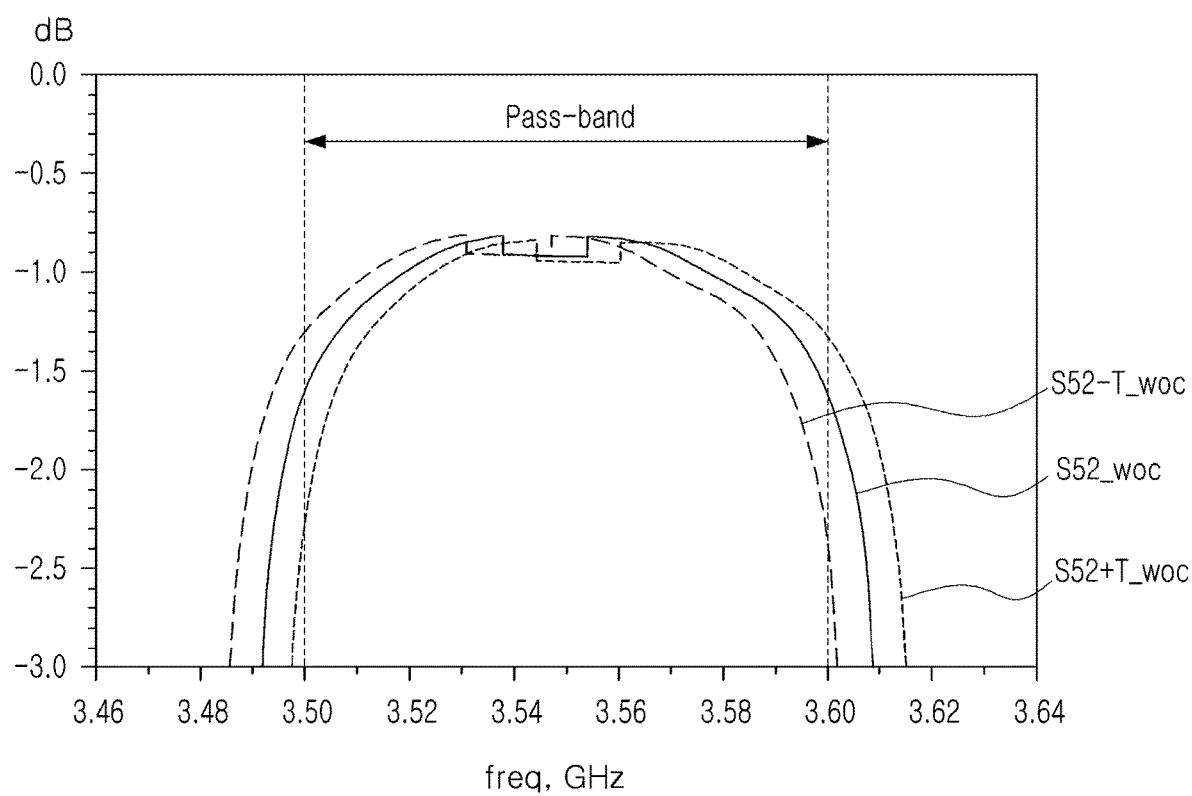
FIG. 6B is a graph illustrating insertion loss of an acoustic resonator filter in which a $SiO_2$ layer of a shunt acoustic resonator is omitted.

FIG. 6A is a graph illustrating insertion loss of an acoustic resonator filter according to an example of the present disclosure, and FIG. 6B is a graph illustrating insertion loss of an acoustic resonator filter in which a $SiO_2$ layer of a shunt acoustic resonator is omitted.

Referring to FIG. 6A, a difference between an S-parameter S52 at 25 degrees Celsius, an S-parameter S52−T at −40 degrees Celsius, and an S-parameter S52+T at 90 degrees Celsius, in the acoustic resonator filter illustrated in FIG. 1F, may be relatively small.

For example, the acoustic resonator filter according to an embodiment of the present disclosure may have insertion loss of less than 2.27 dB at a temperature between −40 degrees Celsius to +95 degrees Celsius and a frequency of 3.5 GHz, and may have insertion loss of less than 2.33 dB at a temperature between −40 degrees Celsius to +95 degrees Celsius and a frequency of 3.6 GHz.

Referring to FIG. 6B, a difference between an S-parameter S52_woc at 25 degrees Celsius, an S-parameter S52−T_woc at −40 degrees Celsius, and an S-parameter S52+T_woc at 90 degrees Celsius, in the acoustic resonator filter in which the $SiO_2$ layer of the shunt acoustic resonator is omitted, may be relatively large. In this case, the acoustic resonator filter in which the $SiO_2$ layer of the shunt acoustic resonator is omitted may have insertion loss of 2.27 dB or more at a temperature between −40 degrees Celsius to +95 degrees Celsius and a frequency of 3.5 GHz, and may have insertion loss of 2.33 dB or more at a temperature between −40 degrees Celsius to +95 degrees Celsius and a frequency of 3.6 GHz.

Figure 7A:
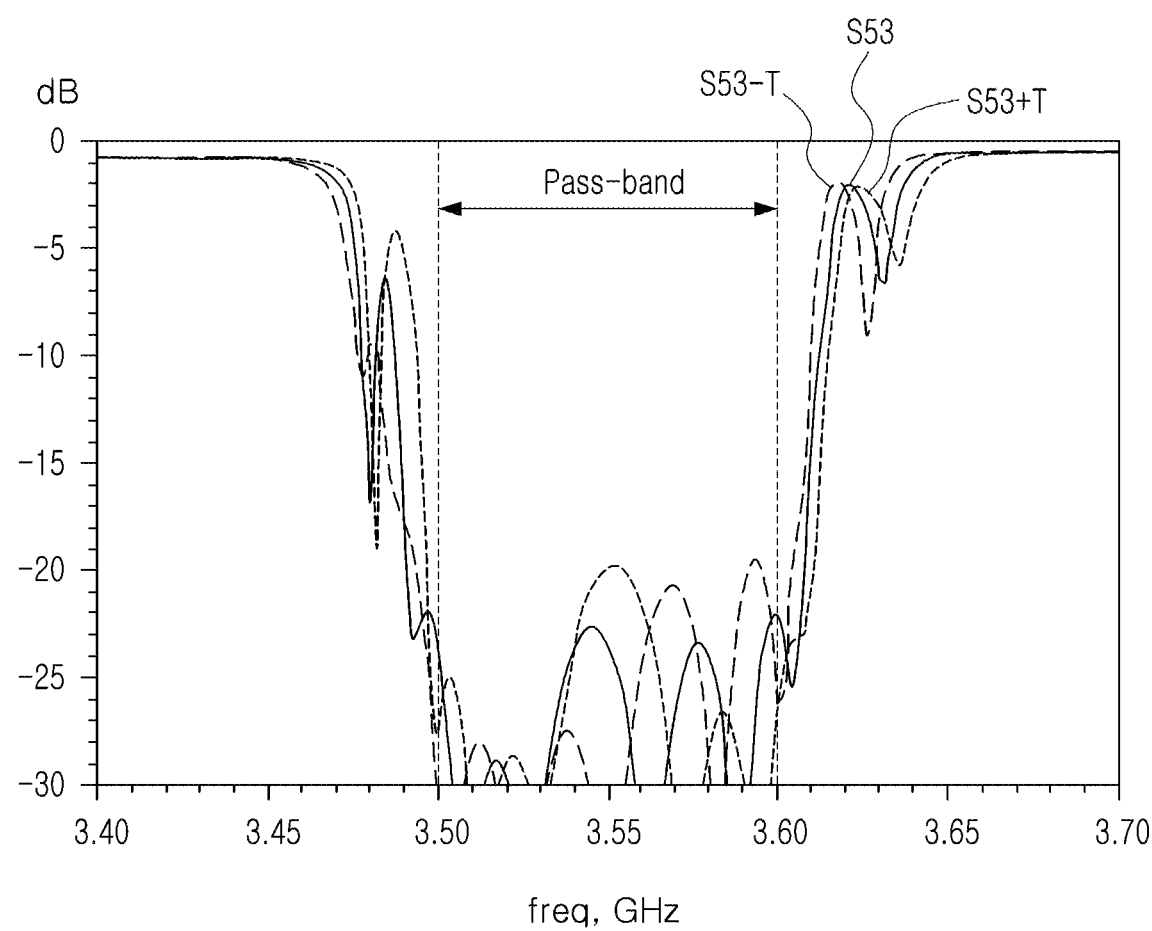
FIG. 7A is a graph illustrating return loss of an acoustic resonator filter according to an example.
Figure 7B:
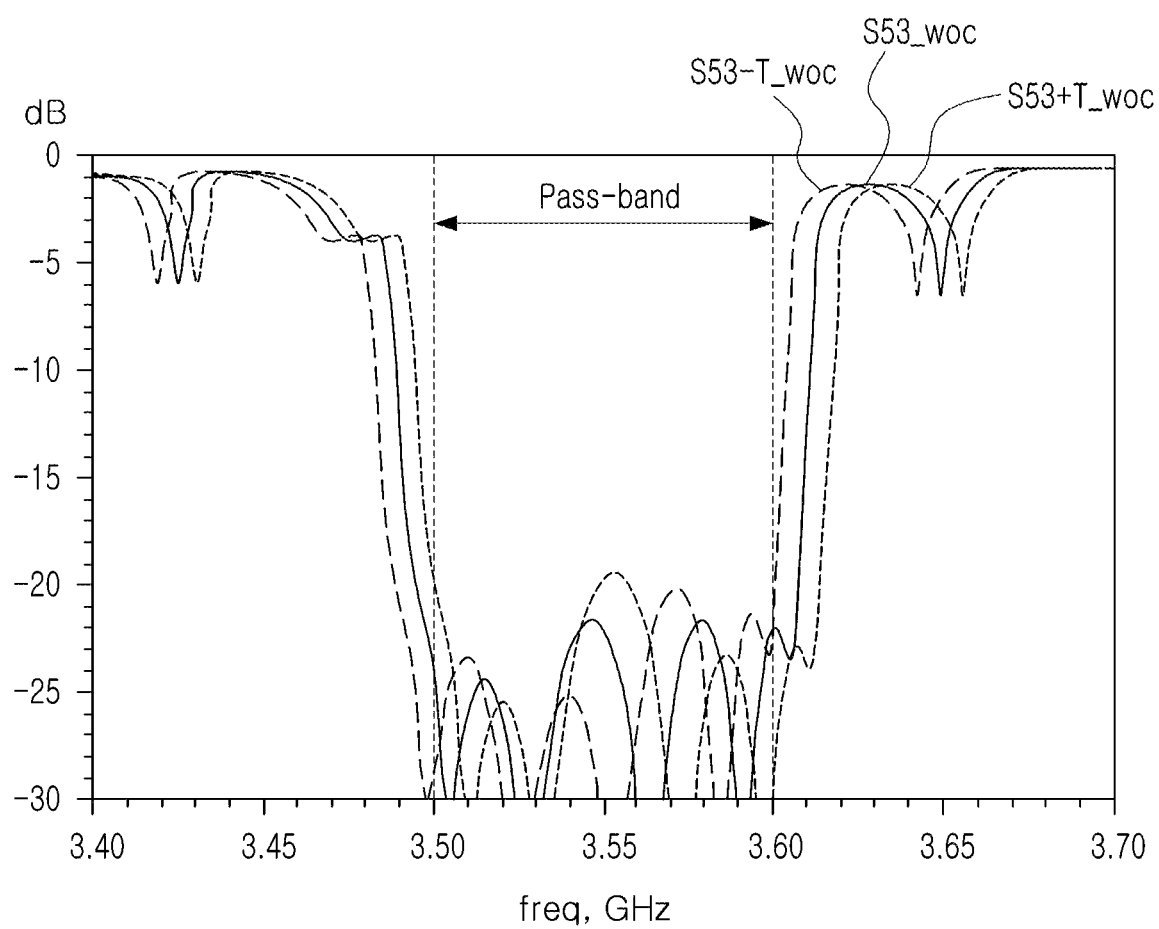
FIG. 7B is a graph illustrating return loss of an acoustic resonator filter in which a $SiO_2$ layer of a shunt acoustic resonator is omitted.

FIG. 7A is a graph illustrating return loss of an acoustic resonator filter according to an example of the present disclosure, and FIG. 7B is a graph illustrating return loss of an acoustic resonator filter in which a SiO$_2$ layer of a shunt acoustic resonator is omitted.

Referring to FIG. 7A, a difference between an S-parameter S53 at 25 degrees Celsius, an S-parameter S53− T at −40 degrees Celsius, and an S-parameter S53+ T at 90 degrees Celsius, in the acoustic resonator filter illustrated in FIG. 1F, may be relatively small.

Referring to FIG. 7B, a difference between an S-parameter S53_woc at 25 degrees Celsius, an S-parameter S53−T_woc at −40 degrees Celsius, and an S-parameter S53+T_woc at 90 degrees Celsius, in the acoustic resonator filter in which the SiO$_2$ layer of the shunt acoustic resonator is omitted, may be relatively large.

Table 1 below illustrates a performance of the acoustic resonator filter illustrated in FIG. 1F.

TABLE 1

| Requirements | | Unit | No SiO$_2$ | Include SiO$_2$ | Conditions |
|---|---|---|---|---|---|
| Insertion Loss | Lower Edge | dB | 1.61 | 1.57 | Max, +25° C. |
| | 3500 MHz | dB | 2.27 | 2.03 | Max, −40 C.~+95 C. |
| | Higher Edge | dB | 1.61 | 1.59 | Max, +25 C. |
| | 3600 MHz | dB | 2.33 | 2.01 | Max, −40 C.~+95 C. |
| Pass Band | Any 20 MHz | dB | 0.62 | 0.60 | Max, +25 C. |
| Ripple | | dB | 1.18 | 0.95 | Max, −40 C.~+95 C. |
| | Any 100 MHz | dB | 0.79 | 0.78 | Max, +25 C. |
| | | dB | 1.52 | 1.21 | Max, −40 C.~+95 C. |
| | Return Loss | dB | 21.7 | 22.1 | Min, +25 C. |
| | | dB | 17.1 | 19.1 | Min, −40 C.~+95 C. |
| Attenuation | 3460  3480 | dB | 13.01 | 13.0 | Min, −40 C.~+95 C. |
| (MHz) | 3620  3640 | dB | 12.86 | 13.1 | |

A performance of the acoustic resonator filter may include insertion loss, pass band ripple, return loss, and attenuation.

A difference between a performance of the acoustic resonator filter in which the SiO$_2$ layer of the shunt acoustic resonator is omitted in a temperature range of −40 degrees Celsius to 90 degrees Celsius, and a performance of the acoustic resonator filter according to an embodiment of the present disclosure in a temperature range of −40 to 90 degrees Celsius may be relatively higher, as compared to a difference in performance at a temperature of 25 degrees Celsius.

In addition, an overall performance of the acoustic resonator filter may be more improved, as compared to an overall performance of the acoustic resonator filter in which the SiO$_2$ layer of the shunt acoustic resonator is omitted.

For example, an acoustic resonator filter according to an example of the present disclosure may reduce temperature sensitivity to have more stable performance (e.g., attenuation, insertion loss, return loss, pass band ripple, and the like) and temperature robustness, while suppressing an increase in overall energy loss due to the reduction in temperature sensitivity.

Figure 8:
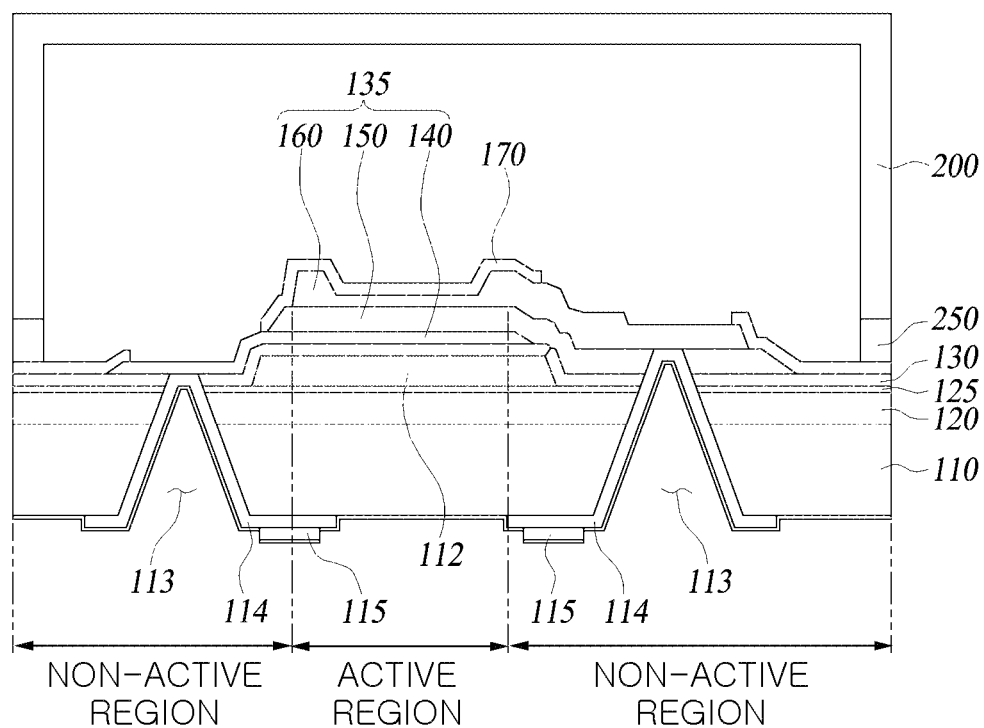
FIG. 8 is a side view illustrating a specific structure of an acoustic resonator of an acoustic resonator filter according to an example.

FIG. 8 is a side view illustrating a specific structure of an acoustic resonator of an acoustic resonator filter according to an example of the present disclosure.

Referring to FIG. 8, an acoustic resonator of an acoustic resonator filter according to an example of the present disclosure may be a bulk-acoustic resonator 10, and may also be a film bulk acoustic resonator (FBAR) or a solidly mounted resonator (SMR).

The bulk-acoustic resonator 10 may include a stack structure including a substrate 110, an insulating layer 120, an air cavity 112, and a resonance unit 135, and a cap 200 coupled to the stack structure.

The substrate 110 may be formed of a conventional silicon substrate. The insulating layer 120 electrically isolating the resonance unit 135 from the substrate 110 may be provided on an upper surface of the substrate 110. The insulating layer 120 may be formed on the substrate 110 by using one of silicon dioxide (SiO$_2$) and aluminum oxide (Al$_2$O$_3$) by chemical vapor deposition, RF magnetron sputtering, or evaporation.

The air cavity 112 may be disposed on the insulating layer 120. The air cavity 112 may be located below the resonance unit 135 to vibrate the resonance unit 135 in a predetermined direction. The air cavity 112 may be prepared by forming a sacrificial layer on the insulating layer 120, forming a membrane 130 on the sacrificial layer, and then etching and removing the sacrificial layer. The membrane 130 may function as an oxide protective layer, or may function as a protective layer protecting the substrate 110.

An etch stop layer 125 may be additionally formed between the insulating layer 120 and the air cavity 112. The etch stop layer 125 may serve to protect the substrate 110 and the insulating layer 120 from an etching process, and may serve as a base for depositing other layers on the etch stop layer 125.

The SiO$_2$ layer illustrated in FIG. 3A may be formed in a manner similar to that of the insulating layer 120, and may be formed on the insulating layer 120. For example, the SiO$_2$ layer may be formed between a first electrode 140 and a second electrode 160.

A seed layer for improving crystal orientation of a piezoelectric layer 150 may be additionally disposed below the first electrode 140. The seed layer may be formed of one of aluminum nitride (AlN), zinc oxide (ZnO), lead zirconium titanium oxide (PZT; PbZrTiO), having the same crystallinity as the piezoelectric layer 150.

The resonance unit 135 may be divided into an active region and a non-active region. The active region of the resonance unit 135 may be a region that vibrates and resonates in a predetermined direction by a piezoelectric phenomenon occurring in the piezoelectric layer 150 when electric energy such as a radio frequency signal is applied to the first electrode 140 and the second electrode 160, and may correspond to a region in which the first electrode 140, the piezoelectric layer 150, and the second electrode 160 overlap each other on the cavity 112 in a vertical direction. The non-active region of the resonance unit 135 may be a region that does not resonate by a piezoelectric phenomenon even when electric energy is applied to the first electrode 140 and the second electrode 160, and may correspond to a region outside the active region.

The resonance unit 135 may use a piezoelectric phenomenon to output a radio frequency signal having a specific frequency. Specifically, the resonance unit 135 may output a radio frequency signal having a resonance frequency corresponding to vibration caused by the piezoelectric phenomenon of the piezoelectric layer 150.

A protective layer 170 may be disposed on the second electrode 160 of the resonance unit 135, to prevent the second electrode 160 from being externally exposed. The protective layer 170 may be formed of one of a silicon oxide-based insulating material, a silicon nitride-based insulating material, or an aluminum nitride-based insulating material. Although a single stack structure is accommodated in a single cap 200, as illustrated in FIG. 8, a plurality of stack structures may be accommodated in a single cap 200, and each of the plurality of stack structures may be interconnected, depending on a design. In this case, wiring electrodes may be provided on the first electrode 140 and the second electrode 160 externally exposed, to interconnect the plurality of stack structures.

The cap 200 may be joined to the stack structure, to protect the resonance unit 135 from an external environment. The cap 200 may be formed to have a cover shape having an internal space in which the resonance unit 135 is accommodated. Specifically, the cap 200 may have an accommodating portion formed in a central portion to accommodate the resonant portion 135, and may be coupled to the stack structure in an edge portion. The cap 200 is joined to the protective layer 170 stacked on the substrate 110, as illustrated in FIG. 8, but not only this, but also the cap 200 may pass through the protective layer 170, to be joined to at least one of the membrane 130, the etch stop layer 125, the insulating layer 120, or the substrate 110.

The cap 200 may be joined to the substrate 110 by eutectic bonding. In this case, after depositing an adhesive 250 capable of eutectic bonding with the substrate 110 on the stack structure, a substrate wafer and a cap wafer may be pressed and heated, to join them. The adhesive 250 may include a eutectic material of copper (Cu)-tin (Sn), and, in addition, may also include solder balls.

At least one via hole 113 passing through the substrate 110 in a thickness direction may be formed on a lower surface of the substrate 110. In addition to the substrate 110, the via hole 113 may pass through a portion of the insulating layer 120, the etch stop layer 125, and the membrane 130 in the thickness direction. A connection pattern 114 may be formed inside the via hole 113, and the connection pattern 114 may be formed on an inner surface of the via hole 113, e.g., an entire inner wall of the via hole 113. Depending on a design, the via hole 113 may be omitted, and a structure of the connection pattern 114 may be replaced with a structure of a wire bonding.

The connection pattern 114 may be prepared by forming a conductive layer on the inner surface of the via hole 113. For example, the connection pattern 114 may be formed by depositing, coating, or filling a conductive metal such as gold or copper along the inner wall of the via hole 113. For example, the connection pattern 114 may be made of a titanium (Ti)-copper (Cu) alloy.

The connection pattern 114 may be connected to at least one of the first electrode 140 or the second electrode 160. For example, the connection pattern 114 may pass through at least a portion of the substrate 110, the membrane 130, the first electrode 140, and the piezoelectric layer 150, to be electrically connected to at least one of the first electrode 140 or the second electrode 160. The connection pattern 114 formed on the inner surface of the via hole 113 may extend toward the lower surface of the substrate 110, and may be connected to a connection pad 115 for a substrate to be provided on the lower surface of the substrate 110. Therefore, the connection pattern 114 may electrically connect the first electrode 140 and the second electrode 160 to the connection pad 115 for a substrate.

The substrate connection pad 115 may be electrically connected to an external substrate that may be disposed below the bulk-acoustic resonator 10, by bumps. The bulk-acoustic resonator 10 may perform a filtration operation of a radio frequency signal, by a signal applied to the first and second electrodes 140 and 160 through the connection pad 115 for a substrate.

An acoustic resonator filter according to the various examples of the present disclosure may reduce temperature sensitivity to have more stable performance (e.g., attenuation, insertion loss, return loss, pass band ripple, and the like) and temperature robustness, while suppressing an increase in overall energy loss due to the reduction in temperature sensitivity.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator filter comprising:
at least one series acoustic resonator electrically connected between a first port and a second port in series, and configured to pass a radio frequency (RF) signal;
at least one second shunt acoustic resonator electrically shunt-connected between the at least one series acoustic resonator and a ground; and
at least one first shunt acoustic resonator electrically shunt-connected between the at least one series acoustic resonator and the ground and having a resonance frequency higher than a resonance frequency of the at least one second shunt acoustic resonator,
wherein at least one shunt acoustic resonator, among the at least one first shunt acoustic resonator and the at least one second shunt acoustic resonator, has a temperature coefficient of frequency (TCF) corresponding to resonance frequency sensitivity more insensitive than resonance frequency sensitivity according to a change in temperature of the at least one series acoustic resonator filter, and
wherein the at least one second shunt acoustic resonator includes one or more second shunt acoustic resonators connected to the at least one first shunt acoustic resonator in series and one or more second shunt acoustic resonators connected to the at least one first shunt acoustic resonator in parallel.

2. The acoustic resonator filter of claim 1, wherein the resonance frequency of the at least one first shunt acoustic resonator is closer to the resonance frequency of the at least one series acoustic resonator than the resonance frequency of the at least one second shunt acoustic resonator.

3. The acoustic resonator filter of claim 1, further comprising:
an inductor electrically connected between one or both of the at least one first shunt acoustic resonator and the at least one second shunt acoustic resonator and the ground in series.

4. The acoustic resonator filter of claim 1, wherein a difference between a bandwidth at −40 degrees Celsius and a bandwidth at +95 degrees Celsius is less than 20 MHz.

5. The acoustic resonator filter of claim 4, having insertion loss of less than 2.27 dB at a temperature between −40 degrees Celsius and +95 degrees Celsius and a frequency of 3.5 GHz, and having insertion loss of less than 2.33 dB at a temperature between −40 degrees Celsius and +95 degrees Celsius and a frequency of 3.6 GHz.

6. The acoustic resonator filter of claim 1, wherein each of the at least one first shunt acoustic resonator, the at least one second shunt acoustic resonator, and the at least one series acoustic resonator comprise a first electrode and a second electrode, spaced apart from each other, respectively; and
a piezoelectric layer disposed between the respective first and second electrodes,
wherein at least one shunt acoustic resonator, among the at least one first shunt acoustic resonator and the at least one second shunt acoustic resonator, comprises a $SiO_2$ layer disposed between the first and second electrodes or disposed to contact one of the first and second electrodes, and
wherein the at least one series acoustic resonator does not include a $SiO_2$ layer or includes a $SiO_2$ layer smaller than the $SiO_2$ layer of the at least one shunt acoustic resonator.

7. The acoustic resonator filter of claim 6, further comprising:
an insulating layer disposed below the at least one first shunt acoustic resonator and the at least one second shunt acoustic resonator and below the at least one series acoustic resonator; and
a substrate disposed below the insulating layer,
wherein the $SiO_2$ layer is disposed on or above the insulating layer.

8. An acoustic resonator filter comprising:
at least one series acoustic resonator electrically connected between a first port and a second port in series, and configured to pass a radio frequency (RF) signal;
at least one second shunt acoustic resonator electrically shunt-connected between the at least one series acoustic resonator and a ground; and
at least one first shunt acoustic resonator electrically shunt-connected between the at least one series acoustic resonator and the ground and having a resonance frequency higher than a resonance frequency of the at least one second shunt acoustic resonator,
wherein each of the at least one first shunt acoustic resonator, the at least one second shunt acoustic resonator, and the at least one series acoustic resonator comprise a first electrode and a second electrode, spaced apart from each other, respectively; and
a piezoelectric layer disposed between the respective first and second electrodes,
wherein at least one shunt acoustic resonator, among the at least one first shunt acoustic resonator and the at least one second shunt acoustic resonator, comprises a $SiO_2$ layer disposed between the first and second electrodes or disposed to contact one of the first and second electrodes, and
wherein the at least one series acoustic resonator does not include a $SiO_2$ layer or includes a $SiO_2$ layer smaller than the $SiO_2$ layer of the at least one shunt acoustic resonator.

9. The acoustic resonator filter of claim 8, further comprising:
an insulating layer disposed below the at least one first shunt acoustic resonator and the at least one second shunt acoustic resonator and below the at least one series acoustic resonator; and
a substrate disposed below the insulating layer,
wherein the $SiO_2$ layer is disposed on or above the insulating layer.

10. The acoustic resonator filter of claim 9, wherein the resonance frequency of the at least one first shunt acoustic resonator is closer to the resonance frequency of the at least one series acoustic resonator than the resonance frequency of the at least one second shunt acoustic resonator.

11. The acoustic resonator filter of claim 10, wherein a difference between a bandwidth at −40 degrees Celsius and a bandwidth at +95 degrees Celsius is less than 20 MHz.

12. The acoustic resonator filter of claim 11, having insertion loss of less than 2.27 dB at a temperature between −40 degrees Celsius and +95 degrees Celsius and a frequency of 3.5 GHz, and having insertion loss of less than 2.33 dB at a temperature between −40 degrees Celsius and +95 degrees Celsius and a frequency of 3.6 GHz.

13. The acoustic resonator filter of claim 11, wherein the at least one second shunt acoustic resonator includes one or more second shunt acoustic resonators electrically connected to a first end of one series acoustic resonator, among the at least one series acoustic resonators, and one or more second shunt acoustic resonators electrically connected to a second end of the one series acoustic resonator, and having different TCFs.

14. The acoustic resonator filter of claim 8, wherein the at least one second shunt acoustic resonator includes one or more second shunt acoustic resonators connected to the at least one first shunt acoustic resonator in series and one or more second shunt acoustic resonators connected to the at least one first shunt acoustic resonator in parallel.

15. An acoustic resonator filter comprising:
at least one series acoustic resonator electrically connected between a first port and a second port in series, and configured to pass a radio frequency (RF) signal;
at least one second shunt acoustic resonator electrically shunt-connected between the at least one series acoustic resonator and a ground; and
at least one first shunt acoustic resonator electrically shunt-connected between the at least one series acoustic resonator and the ground and having a resonance frequency higher than a resonance frequency of the at least one second shunt acoustic resonator,
wherein at least one shunt acoustic resonator, among the at least one first shunt acoustic resonator and the at least one second shunt acoustic resonator, has a temperature coefficient of frequency (TCF) corresponding to resonance frequency sensitivity more insensitive than resonance frequency sensitivity according to a change in temperature of the at least one series acoustic resonator filter, and wherein a difference between a bandwidth at −40 degrees Celsius and a bandwidth at +95 degrees Celsius is less than 20 MHz.

16. The acoustic resonator filter of claim 15, wherein the at least one second shunt acoustic resonator includes one or more second shunt acoustic resonators electrically connected to a first end of one series acoustic resonator, among the at least one series acoustic resonators, and one or more second shunt acoustic resonators electrically connected to a second end of the one series acoustic resonator, and having different TCFs.

17. The acoustic resonator filter of claim 16, further comprising:
a plurality of inductors electrically connected between the at least one second shunt acoustic resonator and the ground in series; and
a capacitor electrically connected between the at least one second shunt acoustic resonator and the ground in series.

18. The acoustic resonator filter of claim 15, having insertion loss of less than 2.27 dB at a temperature between −40 degrees Celsius and +95 degrees Celsius and a frequency of 3.5 GHz, and having insertion loss of less than 2.33 dB at a temperature between −40 degrees Celsius and +95 degrees Celsius and a frequency of 3.6 GHz.

19. The acoustic resonator filter of claim 15, wherein each of the at least one first shunt acoustic resonator, the at least one second shunt acoustic resonator, and the at least one series acoustic resonator comprise a first electrode and a second electrode, spaced apart from each other, respectively; and
a piezoelectric layer disposed between the respective first and second electrodes,
wherein at least one shunt acoustic resonator, among the at least one first shunt acoustic resonator and the at least one second shunt acoustic resonator, comprises a $SiO_2$ layer disposed between the first and second electrodes or disposed to contact one of the first and second electrodes, and
wherein the at least one series acoustic resonator does not include a $SiO_2$ layer or includes a $SiO_2$ layer smaller than the $SiO_2$ layer of the at least one shunt acoustic resonator.

20. The acoustic resonator filter of claim 19, further comprising:
an insulating layer disposed below the at least one first shunt acoustic resonator and the at least one second shunt acoustic resonator and below the at least one series acoustic resonator; and
a substrate disposed below the insulating layer,
wherein the $SiO_2$ layer is disposed on or above the insulating layer.

* * * * *